(12) United States Patent
Ma et al.

(10) Patent No.: US 6,876,053 B1
(45) Date of Patent: Apr. 5, 2005

(54) ISOLATION STRUCTURE CONFIGURATIONS FOR MODIFYING STRESSES IN SEMICONDUCTOR DEVICES

(75) Inventors: Qing Ma, San Jose, CA (US); Jin Lee, Mountain View, CA (US); Harry Fujimoto, Sunnyvale, CA (US); Changhong Dai, San Jose, CA (US); Shiuh-Wuu Lee, San Jose, CA (US); Travis Eiles, San Jose, CA (US); Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/374,502

(22) Filed: Aug. 13, 1999

(51) Int. Cl.[7] .................... H01L 29/00; H01L 29/76; H01L 31/113; H01L 31/119
(52) U.S. Cl. .................. 257/500; 257/369; 257/374; 257/499; 257/401; 257/506
(58) Field of Search ................. 257/500, 499, 257/374, 501, 506, 369

(56) References Cited

U.S. PATENT DOCUMENTS

| | | | | |
|---|---|---|---|---|
| 5,395,790 A | * | 3/1995 | Lur | 437/69 |
| 5,923,073 A | * | 7/1999 | Aoki et al. | 257/501 |
| 6,083,797 A | * | 7/2000 | Wong et al. | 438/296 |
| 6,091,129 A | * | 7/2000 | Cleeves | 257/510 |
| 6,144,076 A | * | 11/2000 | Puchner et al. | 257/369 |
| 6,175,138 B1 | * | 1/2001 | Noda | 257/392 |
| 6,455,912 B1 | * | 9/2002 | Kim et al. | 257/506 |

OTHER PUBLICATIONS

Hamada et al., "A New Aspect of Mechanical Stress Effects in Scaled MOS Devices," IEEE Transactions on Electron Devices, vol. 38, No. 4, Apr. 1991, pp. 895–900.

* cited by examiner

Primary Examiner—Tom Thomas
Assistant Examiner—Jesse A. Fenty
(74) Attorney, Agent, or Firm—Robert G. Winkle

(57) ABSTRACT

An apparatus and methods for modifying isolation structure configurations for MOS devices to either induce or reduce tensile and/or compressive stresses on an active area of the MOS devices. The isolation structure configurations according to the present invention include the use of low-modulus and high-modulus, dielectric materials, as well as, tensile stress-inducing and compressive stress-inducing, dielectric materials, and further includes altering the depth of the isolation structure and methods for modifying isolation structure configurations, such as trench depth and isolation materials used, to modify (i.e., to either induce or reduce) tensile and/or compressive stresses on an active area of a semiconductor device.

7 Claims, 25 Drawing Sheets

ISOLATION STRUCTURE CONFIGURATIONS FOR MODIFYING STRESSES IN SEMICONDUCTOR DEVICES

BACKGROUND OF THE INVENTION

1. Field of the Invention

The present invention relates to apparatus and methods for modifying stresses in semiconductor devices. In particular, the present invention relates to modifying isolation structure configurations, such as trench depth and isolation materials used, to either induce or reduce tensile and/or compressive stresses on an active area of MOS semiconductor devices.

2. State of the Art

Semiconductor integrated circuits are formed by chemically and physically forming circuit components in and on a semiconductor substrate. These circuit components are generally conductive (e.g., for conductor and resistor fabrication) and may be of different conductivity types (e.g., for transistor and diode fabrication). Thus, when forming such circuit components, it is essential that they are electrically isolated from one another, wherein electrical communication between the isolated circuit components is achieved through discrete electrical traces.

Various techniques have been developed for electrically isolating integrated circuit components formed in the semiconductor substrate. One such technique is known as trench isolation. The trench isolation technique involves forming a channel or trench in the semiconductor substrate, usually by etching techniques well known in the art. The trench is formed to surround the circuit components to be isolated and filled with a dielectric material, thereby electrically isolating the circuit components.

FIGS. 22 and 23 illustrate in side cross-sectional view and in top plan view, respectively, components of a MOSFET (Metal Oxide Semiconductor Field Effect Transistor). As shown in FIG. 22, a source region 202 and a drain region 204 are implanted in a semiconductor substrate 206. The source region 202 and the drain region 204 may be implanted with either a p-type material, such as boron, to form a pMOS (p-channel Metal Oxide Semiconductor) transistor or an n-type material, usually phosphorous and/or arsenic, to form an nMOS (n-channel Metal Oxide Semiconductor) transistor.

A gate structure 208 spans a region of the semiconductor substrate 206 between the source region 202 and the drain region 204. An exemplary gate structure 208 comprises a conductive material 212 electrically isolated with dielectric spacers 214 and 214' adjacent the source region 202 and the drain region 204, a lower dielectric layer 216, and a cap layer 218.

The source region 202 and the drain region 204 are isolated with an isolation structure 222 (i.e., a dielectric-filled trench) extending into the semiconductor substrate 206, preferably beyond the depth of the source region 202 and the drain region 204, as shown in FIG. 22. The isolation structure 222 surrounds the source region 202 and the drain region 204, as shown in FIG. 23, to form an island or active area 224. The material which form the gate structure 208 extends beyond the active area 224 to other semiconductor device components (not shown).

It has been reported in literature that stresses on an active area can significantly effect the performance of MOS devices. Hamada in "A New Aspect of Mechanical Stress Effects in Scaled MOS Device", IEEE Transactions on Electron Devices, vol. 38 (1991), pp. 895–900 illustrated that stresses of the order of 100 MPa can affect performance by a few percent. In the reported experiments, well-controlled uniaxial stresses were applied on MOS devices by using a 4-point bending technique. The stresses were applied both parallel and perpendicular to the channel current direction and for both nMOS and pMOS devices. The results showed that for nMOS devices, tensile stress in both directions improves performance, while compressive stress degrades performance. These effects have been found to be more significant for long channel nMOS devices. For pMOS devices, tensile stress perpendicular to the channel current direction improves performance, but tensile stress parallel to the channel current direction degrades performance, and vice versa for compressive stress.

Such degradation in performance is particularly a problem for MOS devices in flip-chip packaging configurations. FIG. 24 illustrates a cross-sectional view of such a packaging configuration. With flip-chip packaging configurations, a semiconductor die 232 is electrically attached to a carrier substrate 234, such as a printed circuit board, with the active surface 236 of the semiconductor die 232 facing the carrier substrate 234. The electrical attachment of the semiconductor die active surface 236 to the carrier substrate 234 is generally achieved by refluxing solder balls 238 between the semiconductor die active surface 236 and the carrier substrate 234 to form an electrical connection between electrical traces on or in the semiconductor die 232 (not shown) and electrical traces on the carrier substrate 234 (not shown). Once electrical attachment of the semiconductor die 232 to the carrier substrate 234 is complete, an underfill material 242 is disposed between the semiconductor die 232 and the carrier substrate 234. The resulting structure is then heated to cure the underfill material 242. However, when the resulting structure is cooled down to room temperature from the underfill cure temperature, a bending curvature develops because the carrier substrate 234 contracts more than the semiconductor die 232 (i.e., due to the thermal expansion mismatch between the carrier substrate 234 and the semiconductor die 232), as shown in FIG. 25. Such bending causes biaxial compressive stresses (illustrated by arrows 248 in FIG. 25) on MOS transistors 246 (shown schematically as rectangles in FIGS. 24 and 25) within the semiconductor die 232.

As previously discussed, these biaxial stresses will degrade nMOS device performance. However, these biaxial stresses will have less of an effect on the performance of a pMOS device due to the cancellation effects of the two perpendicular stress components (i.e., the decrease in performance due to compressive stress perpendicular to the channel current direction is offset by the increase in performance due to the compressive stress parallel to the channel current direction).

Therefore, it would be advantageous to develop a technique to effectively induce or reduce tensile and/or compressive stresses on the active area of a MOS device to improve the operating performance thereof, while utilizing commercially-available, widely-practiced semiconductor device fabrication techniques.

SUMMARY OF THE INVENTION

The present invention relates to apparatus and methods for modifying isolation structure configurations, such as trench depth and isolation materials used, to modify (i.e., to either induce or reduce) tensile and/or compressive stresses on an active area of a semiconductor device. In specific, the present invention relates to a semiconductor device having an active area formed in a semiconductor substrate and an isolation structure comprising at least one dielectric material disposed within a trench which extends into said semiconductor substrate, wherein the isolation structure substantially surrounds the active area, and wherein at least a portion of the isolation structure is adapted to modify stresses incurred on the active area.

The modification of isolation structure configurations is an effective technique of controlling stresses on a semiconductor device active because the isolation structure is on the same relative plane as the active area and, of course, any device structures formed therein. This shared plane allows for a direct transfer or abatement of stresses incurred on the active area due to packaging or other external stress sources.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunct ion with the accompanying drawings to which:

DETAILED DESCRIPTION OF THE ILLUSTRATED EMBODIMENT

Although FIGS. 1–21 illustrate various views of the present invention, these figures are not meant to portray semiconductor devices in precise detail. Rather, these figures illustrate semiconductor devices in a manner to more clearly convey the concepts of the present invention. Additionally, elements common between the figures retain that same numeric designation.

It is recognized that it would be advantageous to modify the stresses acting upon the active area of a MOS device in order to improve performance. Such stress modification might be achieved at the packaging level by applying stresses to the semiconductor die. However, semiconductor dice are usually brittle and break easily under stress. Additionally, it is very difficult to apply a uniform stress across an entire semiconductor die. Thus, an attempt to apply a uniform stress across the semiconductor die would likely result in a non-uniform stress which would, in turn, result in undesirable performance variations in the MOS devices across the semiconductor die.

Figure 1:
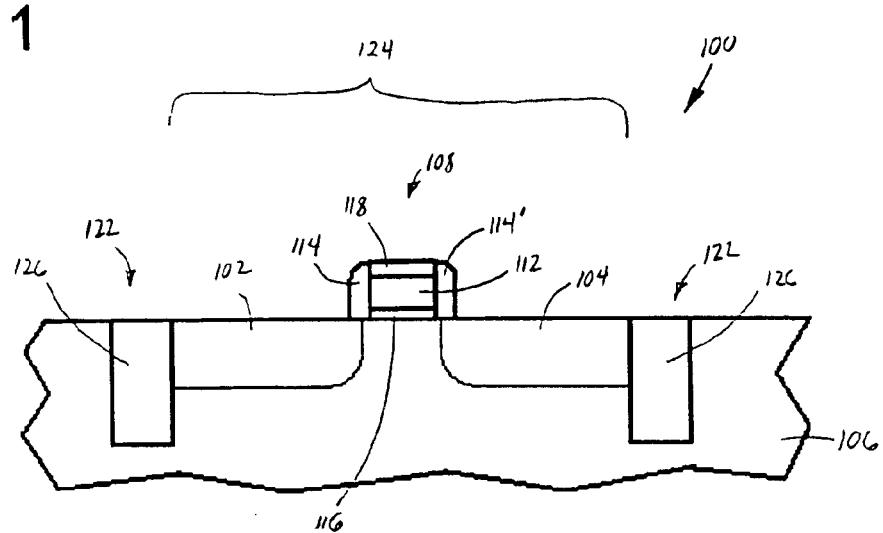
FIGS. 1 and 2 are side cross-sectional and top plan views, respectively, of an nMOS device having stress modifying isolation structures for accommodating compressive stress, according to the present invention.
Figure 2:
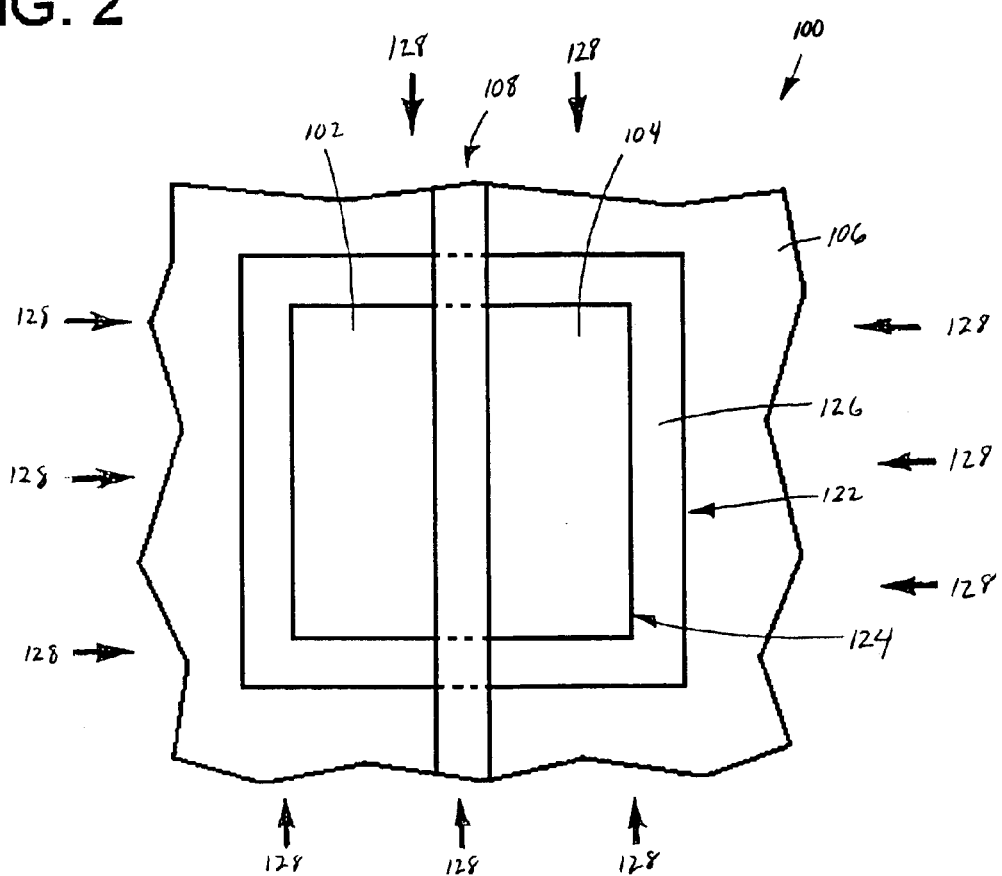

FIGS. 1 and 2 illustrate an embodiment of the present invention for an nMOS device 100. The nMOS device 100 comprises an n-type source region 102 and an n-type drain region 104, which are implanted into a semiconductor substrate 106, such as a silicon wafer, by any known implantation technique. A gate structure 108 spans a region of the semiconductor substrate 106 between the source region 102 and the drain region 104. Generally, the gate structure 108 comprises a conductive material 112 electrically isolated with dielectric spacers 114 and 114' adjacent the source region 102 and the drain region 104, respectively, a lower dielectric layer 116, and a cap layer 118.

Figure 3:
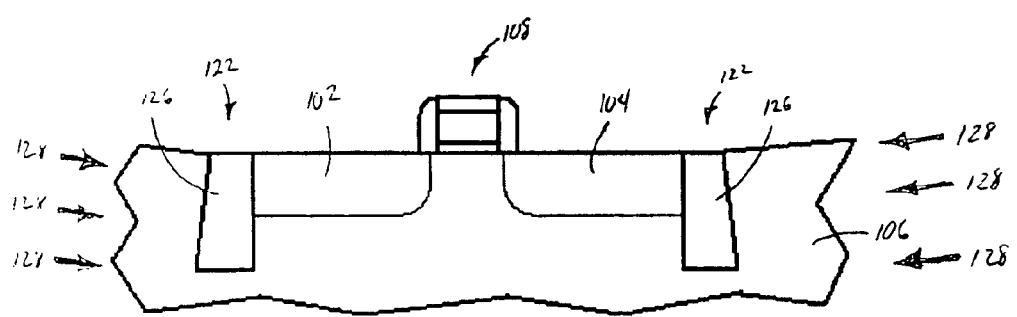
FIG. 3 is a side cross-sectional view of the nMOS device of FIGS. 1 and 2 under compressive stress, according to the present invention.
Figure 4:
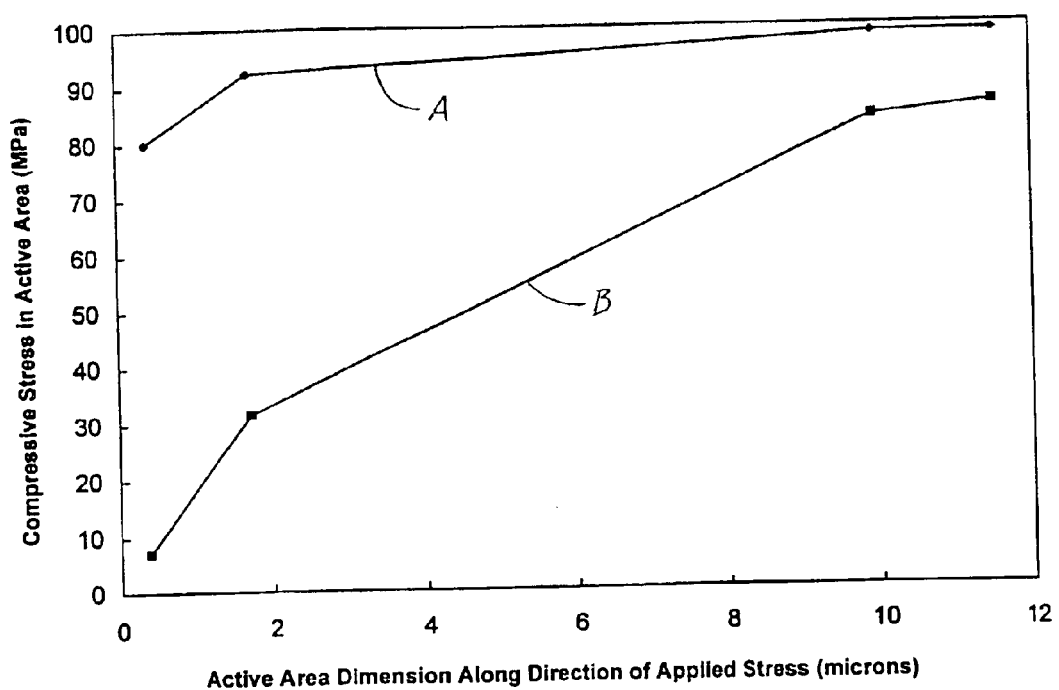
FIG. 4 is a stress model of the effect of the effect of compressive stress applied to a semiconductor die.

The source region 102 and the drain region 104 are isolated with an isolation structure 122, which extends into the semiconductor substrate 106. The isolation structure 122 surrounds the source region 102 and the drain region 104, as shown in FIG. 2, to form an active area 124. The isolation structure 122 includes a dielectric material 126, which has a lower modulus than the semiconductor substrate 106 (i.e., more compliant than the semiconductor substrate 106). Exemplary low-modulus, dielectric materials 126 include, but are not limited to, polymers and porous oxides. As shown in FIG. 3, when compressive stresses (shown as arrows 128 in FIGS. 2 and 3) are incurred on the semiconductor die, such as through flip-chip packaging stress, the low-modulus, dielectric material 126 deforms, thereby eliminating or lessening the detrimental effect of the compressive stress 128 on the active area 124. FIG. 4 shows a stress model, which illustrates this effect using the finite element method. FIG. 4 shows that under 100 MPa compressive stress applied to a semiconductor die front surface, the average stress in the active area (the vertical axis) depends on the modulus of the trench dielectric material. The horizontal axis is the active area dimension along the direction of applied stress. Curve A represents a trench filled with a silicon dioxide with a modulus of between about 70 and 80 GPa, as commonly used as a dielectric material in the industry. Curve B represents a similar trench filled with a complaint dielectric material, specifically polyimide with a modulus of about 5 GPa. Thus, FIG. 4 illustrates that compressive stress on the active areas can be reduced by using more compliant dielectric materials. This compressive stress reduction is more significant for smaller dimension active areas.

Figure 5:
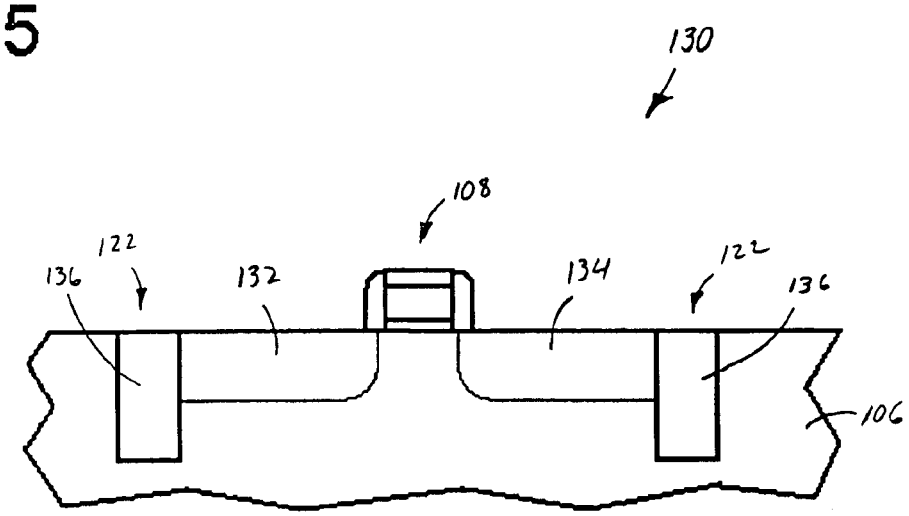
FIGS. 5 and 6 are side cross-sectional and top plan views, respectively, of a pMOS device having stress modifying isolation structures for optimizing pMOS performance when under compressive stress, according to the present invention.
Figure 6:
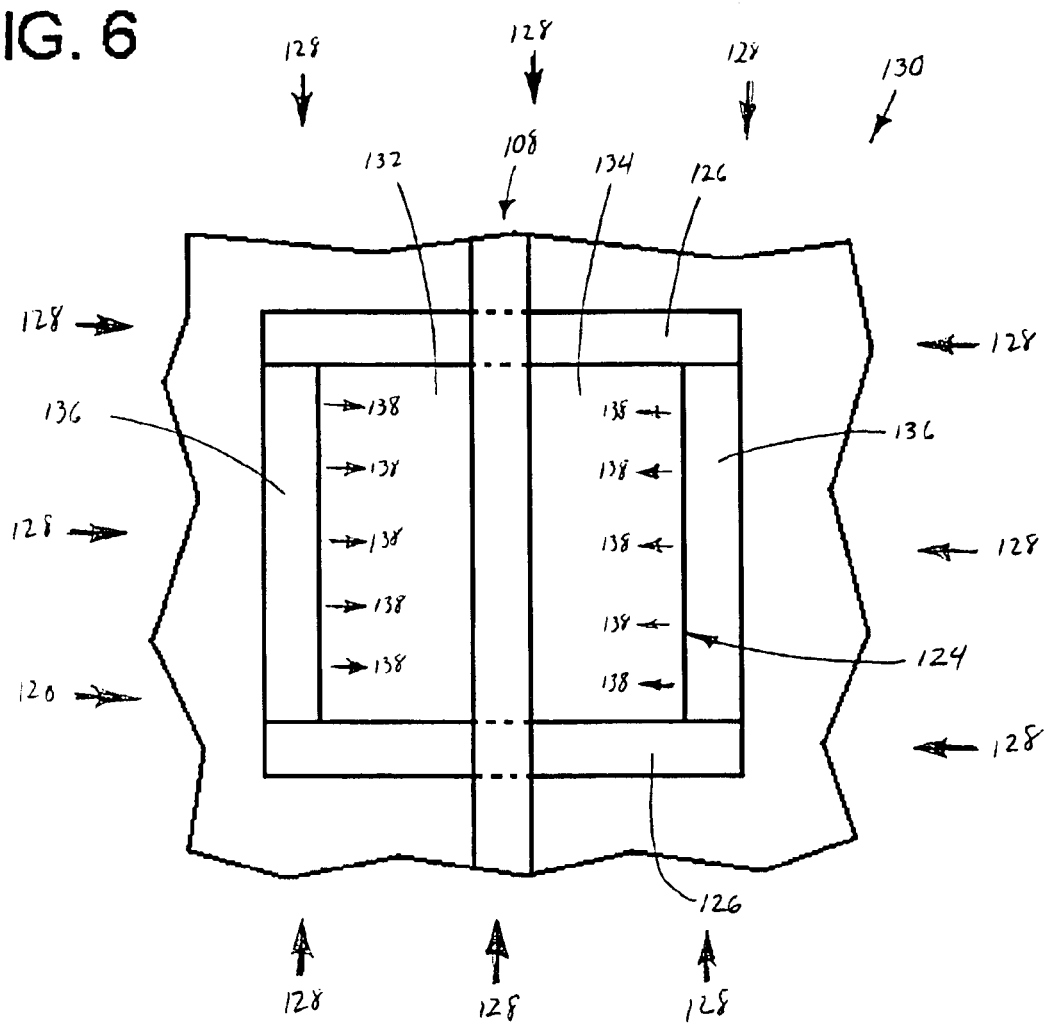

FIGS. 5 and 6 illustrate another embodiment of the present invention for a pMOS device 130. The pMOS device 130 is similar in structure to the nMOS device 100 illustrated in FIGS. 1 and 2 with the exception that the pMOS device 130 has a p-type source region 132 and a p-type drain region 134, as shown in FIG. 5. As previously discussed for pMOS devices, tensile stress perpendicular to the channel current direction improves performance, but tensile stress parallel to the channel current direction degrades performance, and vice versa for compressive stress. As shown in FIG. 6, to improve the performance of the pMOS device, the low-modulus, dielectric material 126 is placed in the isolation structure 122 parallel to the channel current direction to eliminate or lessen the detrimental compressive stress perpendicular to the channel current direction. Furthermore, a high-modulus (stiff), dielectric material 136 is placed in the isolation structure 122 perpendicular to the channel current direction to translate the beneficial compressive stress parallel (shown as arrows 128) to the channel current direction to the active area 124. The high-modulus, dielectric material 136 should have a modulus equal to or higher than a modulus of the semiconductor substrate 106. Therefore, any stresses incurred on the high-modulus, dielectric material 136 will also be incurred on active area 124 with substantially the same force (shown as arrows 138). Exemplary high-modulus, dielectric materials 136 include, but are not limited to, silicon nitride and silicon dioxide, which are deposited to have compressive stresses.

Figure 7:
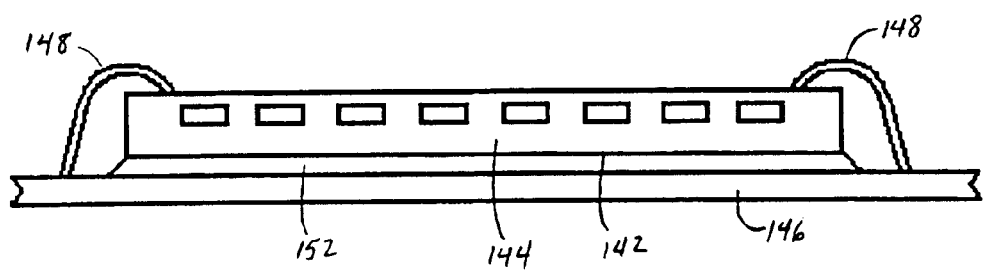
FIG. 7 is a cross-sectional view of a back-bonded packaging configuration.
Figure 8:
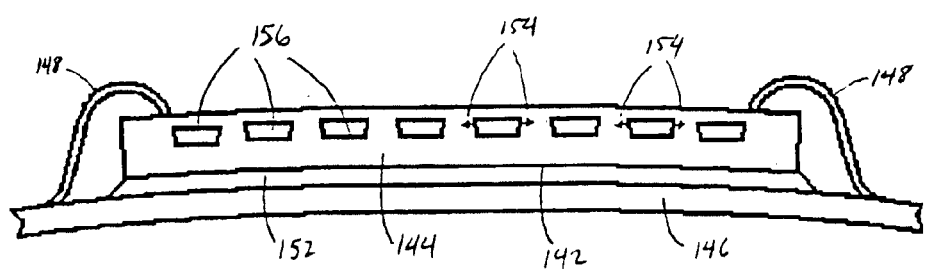
FIG. 8 is a cross-sectional view of the back-bonded packaging configuration of FIG. 7 under stress due to the thermal expansion mismatch.

It is, of course, understood that the use of low-modulus, dielectric material can also improve pMOS device performance in back-bonded packaging configurations. FIGS. 7 and 8 illustrate a back-bonded package 140. With back-bonded packaging configurations, a back surface 142 of a semiconductor die 144 is attached to a carrier substrate 146. Electrical communication between the semiconductor die 144 and the carrier substrate 146 is generally achieved by bond wires 148 extending between electrical traces (not shown) on or in an active surface of the semiconductor die 144 and electrical traces (not shown) on the carrier substrate 146. The attachment of the semiconductor die back surface 142 to the carrier substrate 146 achieved with an adhesive material 152, such as an epoxy resin, as shown in FIG. 7. The resulting structure is then heated to cure the adhesive material 152. However, when the resulting structure is cooled down to room temperature from the adhesive material cure temperature, a bending curvature develops because the carrier substrate 146 contracts more than the semiconductor die 144 (i.e., due to the thermal expansion mismatch between the carrier substrate 146 and the semiconductor die 144), as shown in FIG. 7. Such bending causes biaxial tensile stresses (illustrated by arrows 154 in FIG. 8) on the MOS transistors (shown schematically as rectangles 156 in FIG. 8) within the semiconductor die 144.

Figure 9:
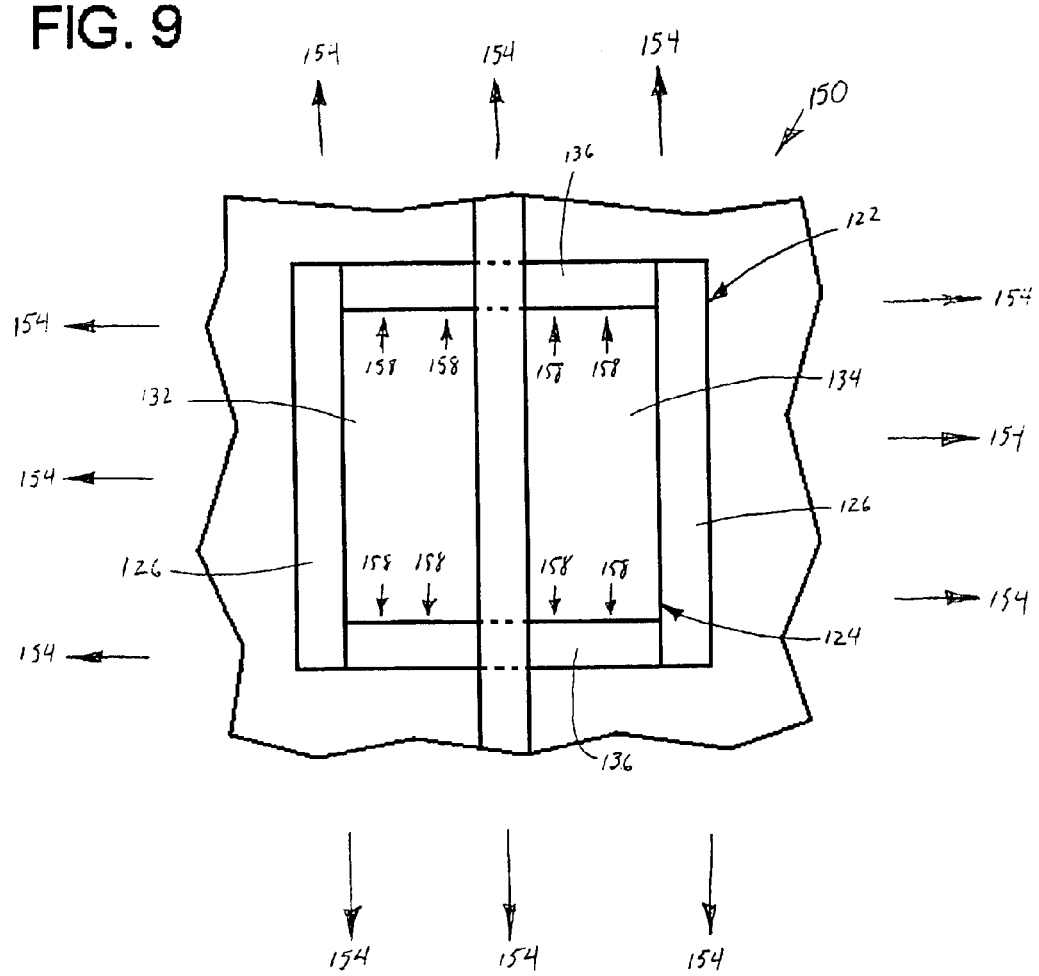
FIG. 9 is a top plan view of a pMOS device having stress modifying isolation structures for optimizing pMOS performance when under tensile stress, according to the present invention.
Figure 10:
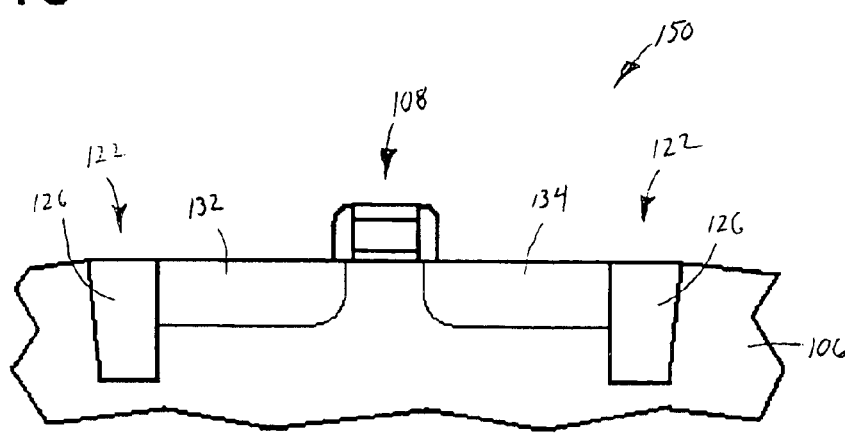
FIG. 10 is a side cross-sectional view of a pMOS device having stress modifying isolation structures when under tensile stress, according to the present invention.

Of course, these biaxial tensile stresses enhance the performance of nMOS devices, but have little effect on the performance of a pMOS device, due to the cancellation effects of the two perpendicular stress components. However, the low-modulus, dielectric material 126 can be used to improve the performance a pMOS device. As shown in FIG. 9, the low-modulus, dielectric material 126 is placed in the isolation structure 122 perpendicular to the channel current direction to eliminate or lessen the a detrimental tensile stress parallel to the channel current direction of pMOS device 150. The parallel tensile stress is eliminated or lessened, because when parallel tensile stress (shown as arrows 154 in FIG. 9) is incurred on the semiconductor die, the low-modulus, dielectric material 126 stretches, as shown in FIG. 10, thereby eliminating or lessening the detrimental effect of the tensile stress 128 on the active area 124. Furthermore, referring to FIG. 9, a high-modulus (stiff), dielectric material 136 may be placed in the isolation structure 122 parallel to the channel current direction to translate the beneficial tensile stress perpendicular to the channel current direction to the active area 124 (translated tensile stress shown as arrows 158).

Figure 11:
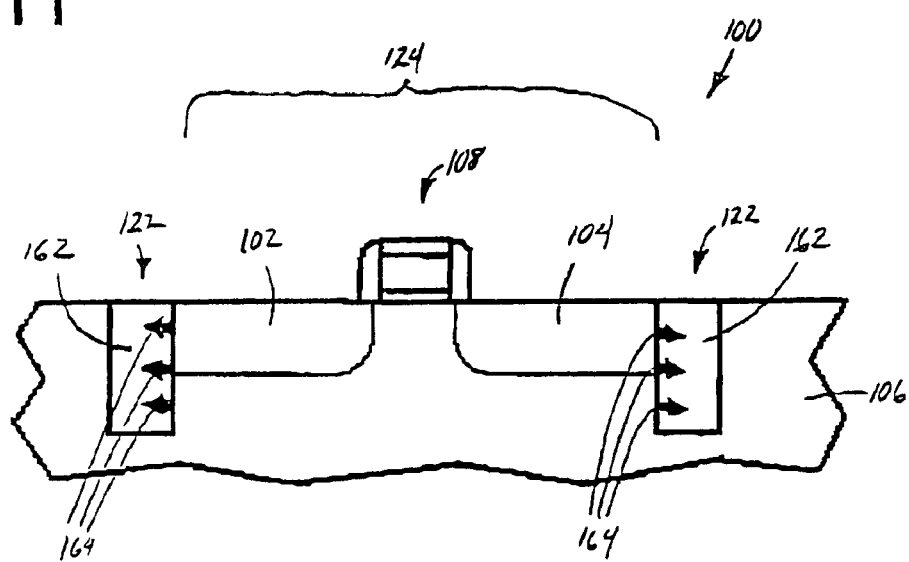
FIGS. 11 and 12 are side cross-sectional and top plan view, respectively, of an nMOS device having tensile stress-inducing, dielectric material disposed in an isolation structure, according to the present invention.
Figure 12:
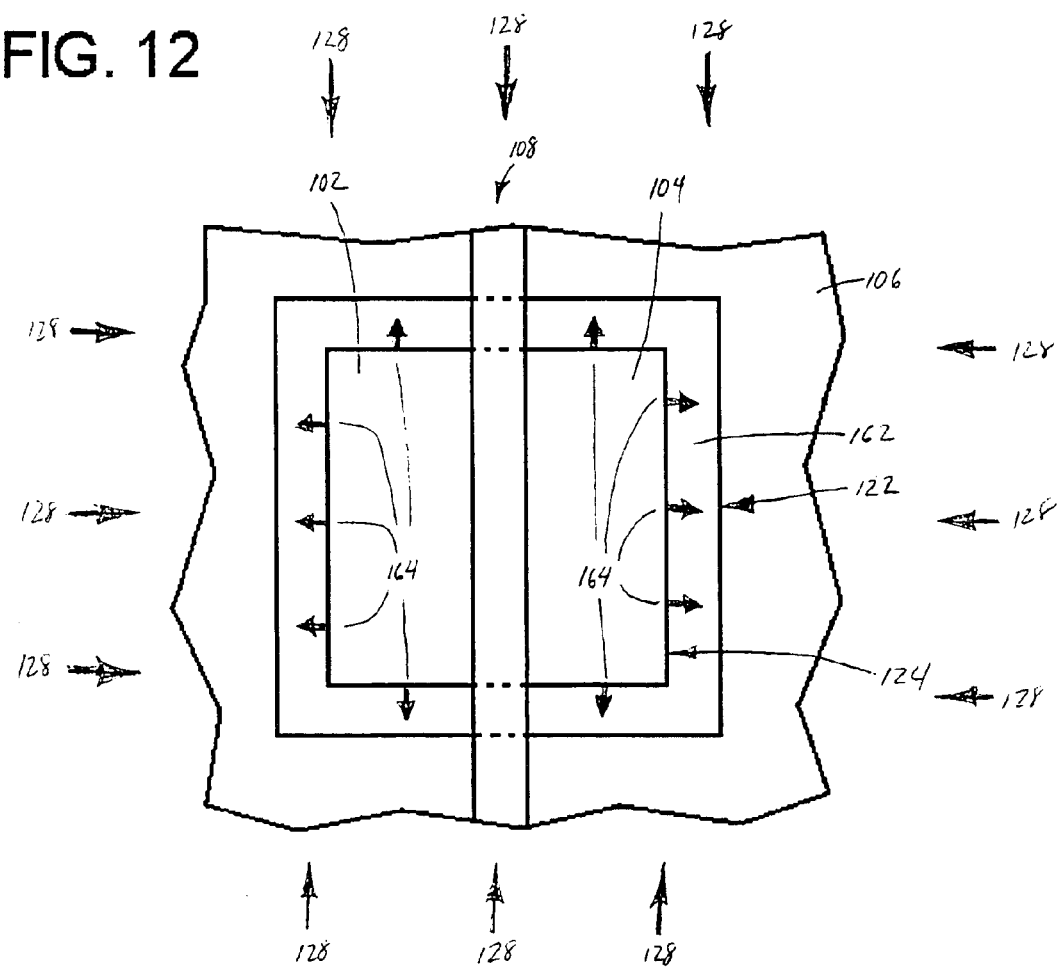

FIGS. 11 and 12 illustrate yet another embodiment of the present invention for an nMOS device 160. The nMOS device 160 illustrated in FIGS. 11 and 12 is similar in structure to the nMOS device 100 illustrated in FIGS. 1 and 2. However, with the present embodiment, the isolation structure 122 includes a dielectric material 162, which has tensile stress-inducing properties (e.g., it creates a tensile stress on adjacent structures and/or materials). Exemplary tensile stress-inducing, dielectric materials 162 include, but are not limited to, silicon nitride which has been deposited to have large tensile stresses. As shown in FIG. 11, the tensile stress-inducing, dielectric material 162 creates a tensile stress (shown as arrows 164) on the active area 124 thereby improving the performance of the nMOS device, even when no external stresses are incurred on the semiconductor die. However, when compressive stresses (shown as arrow 128 in FIG. 12) are incurred on the semiconductor die, the tensile stress-inducing, dielectric material 162 creates the tensile stress (shown as arrows 164) on the active area 124 in a direction opposite the compressive stresses 128, which eliminates or lessens the detrimental effect of the compressive stress 128.

Figure 13:
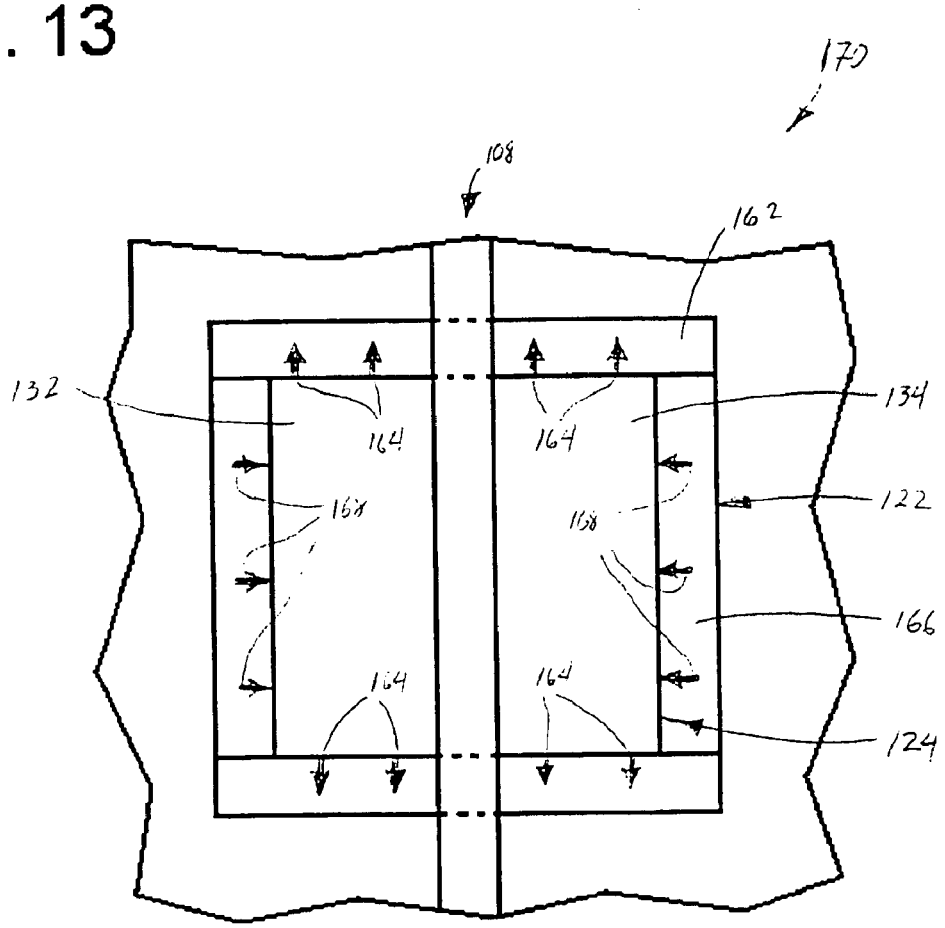
FIG. 13 is a top plan view of a pMOS device having tensile stress-inducing and compressive stress-inducing, dielectric material disposed in an isolation structure, according to the present invention.

FIG. 13 illustrates a still another embodiment of the present invention for a pMOS device 170. The pMOS device 170 is similar in structure to the pMOS device 130 illustrated in FIGS. 5 and 6. As previously discussed for pMOS devices, tensile stress perpendicular to the channel current direction improves performance, but tensile stress parallel to the channel current direction degrades performance, and vice versa for compressive stress. Thus, to improve the performance of the pMOS device, the tensile stress-inducing, dielectric material 162 is placed in the isolation structure 122 parallel to the channel current direction to eliminate or lessen the detrimental compressive stress perpendicular to the channel current direction. Furthermore, a compressive stress-inducing, dielectric material 166 may be placed in the isolation structure 122 perpendicular to the channel current direction to induce the beneficial compressive stress (shown as arrows 168) parallel to the channel current direction to the active area 124. The compressive stress-inducing, dielectric material 166 creates a compressive stress on adjacent structures and/or materials. Exemplary compressive stress-inducing, dielectric materials 166 include, but are not limited to, silicon nitride and silicon dioxide which are deposited to have compressive stresses. Thus, the configuration shown in FIG. 13 improves the performance of the pMOS device when no external stresses are incurred on the semiconductor die or when biaxial compressive or tensile stresses are incurred on the semiconductor die.

Figure 14:
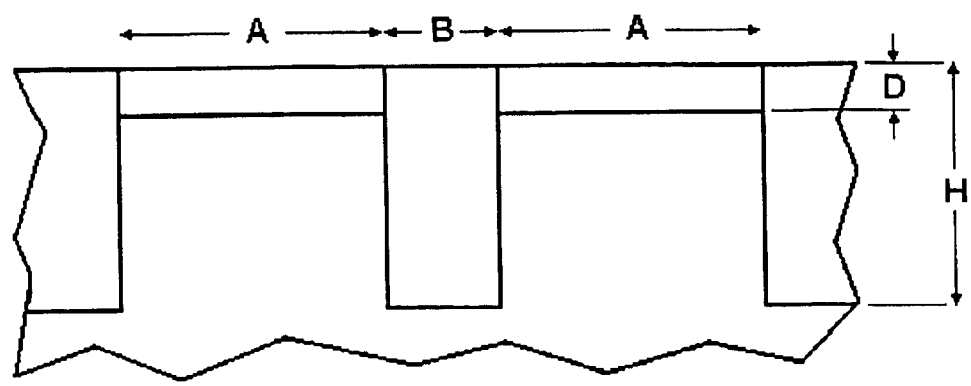
FIGS. 14 and 15 is a model structure and a graph of the results of a numerical simulation using the finite element method for the model structure, respectively, according to the present invention.
Figure 15:
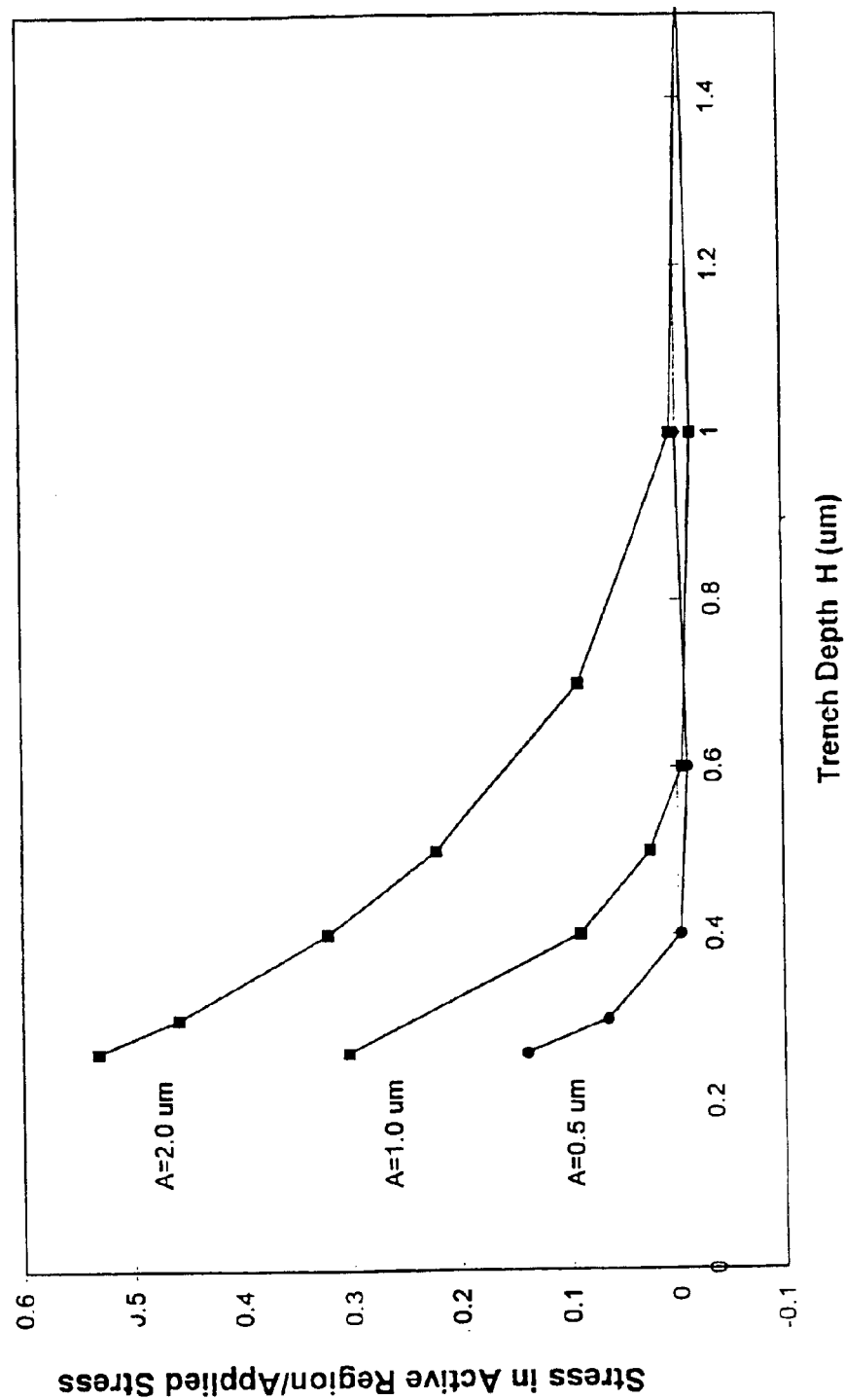

A further embodiment of the present invention involves increasing isolation structure depth to reduce compressive stresses. FIGS. 14 and 15 illustrate a model structure and a graph of the results of a numerical simulation using the finite element method for the model structure, respectively. In FIG. 14, A is the active area width (or length), B is the isolation structure width, H is the trench depth and D is the active area depth. In the simulation, the trench width B was fixed at 0.5 microns (stress incurred on the active area is not significantly sensitive to trench width) and the active region depth D is fixed at 0.25 um (i.e., a typical active region depth). Thus, the active area width A and isolation structure depth H are variables. FIG. 15 illustrates the simulation results with a dielectric material having a modulus of about 5 GPa, wherein the horizontal axis is the trench depth H, and the vertical axis is the compressive stress in the active area normalized by the semiconductor die/packaging thermal mismatch stress (i.e., applied stress). The simulation was performed for three active area widths (i.e., A=2.0 um corresponding to curve A1, A=11.0 um corresponding to curve A2, and A=0.5 um corresponding to curve A3) covering a range of interest. As FIG. 15 illustrates for all the three active area widths, the compressive stresses decreased and approached zero with an increase of trench depth. Furthermore, it is observed that the smaller the active area width A, the less the active area is affected by the applied stress. The increased trench depth makes the carrier substrate 106 more flexible. Thus, when a dielectric material which is more compliant than the carrier substrate is used, the stress on the active area is decreased. Preferably, the structure should have a trench depth H to active area width A aspect ratio (i.e., HWA) of greater than about 0.5.

Figure 16:
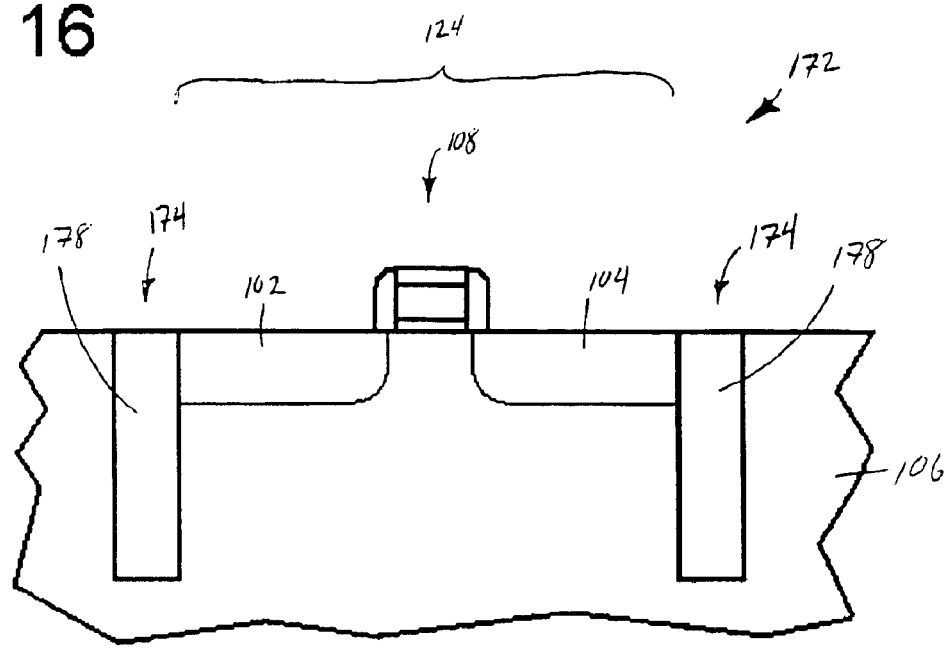
FIGS. 16 and 17 are side cross-sectional and top plan views, respectively, of an nMOS device having deep isolation structures for accommodating compressive stress, according to the present invention.
Figure 17:
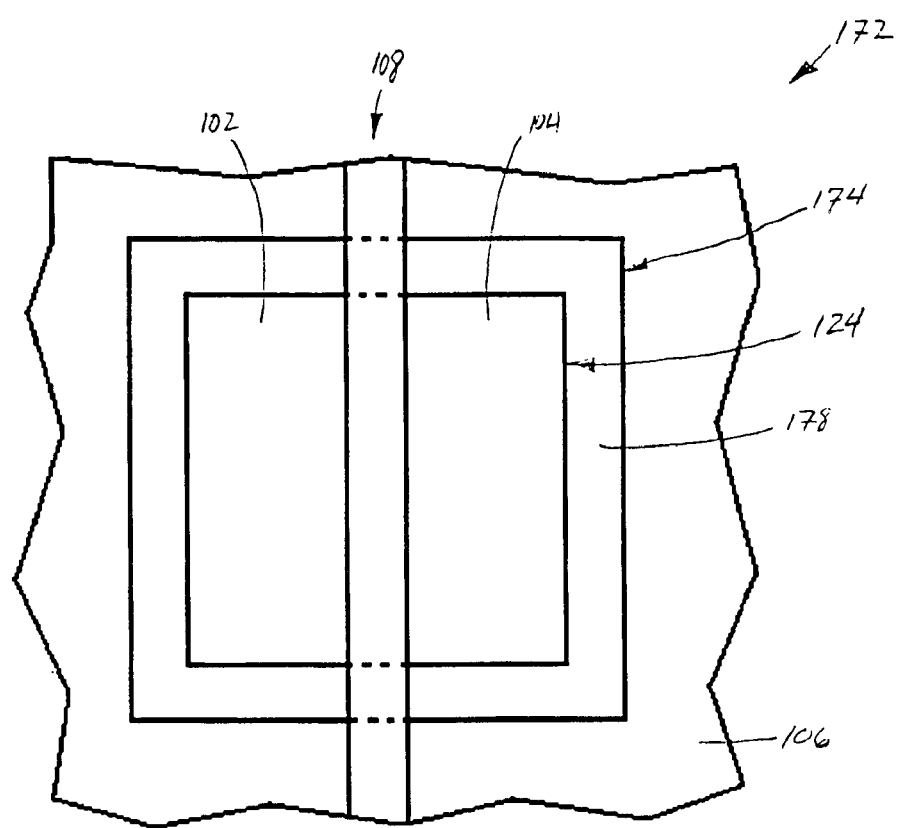

FIGS. 16 and 17 illustrates the deep trench embodiment of the present invention for an nMOS device 172. The nMOS device 172 illustrated in FIG. 16 is similar in structure to the nMOS device 100 illustrated in FIG. 1. However, with the present embodiment, the isolation structure depth is increased to form deep isolation structure 174. The increased depth of the deep isolation structure 174 has been found to reduce compressive stresses on the active area 124. FIG. 17 illustrates a configuration wherein the deep isolation structure 174 surrounds the active area 124. The deep isolation structure 174 includes a dielectric material 178 disposed therein. With the deep isolation structure 174, a standard dielectric material 178, such as silicon dioxide, may be used to isolate the active area 124. However, to further enhance the reduction in compressive stress, the dielectric material 178 may be a low-modulus dielectric material (such as described in regard to FIGS. 1 and 2) or a tensile stress-inducing, dielectric material (such as described in regard to FIGS. 11 and 12).

Figure 18:
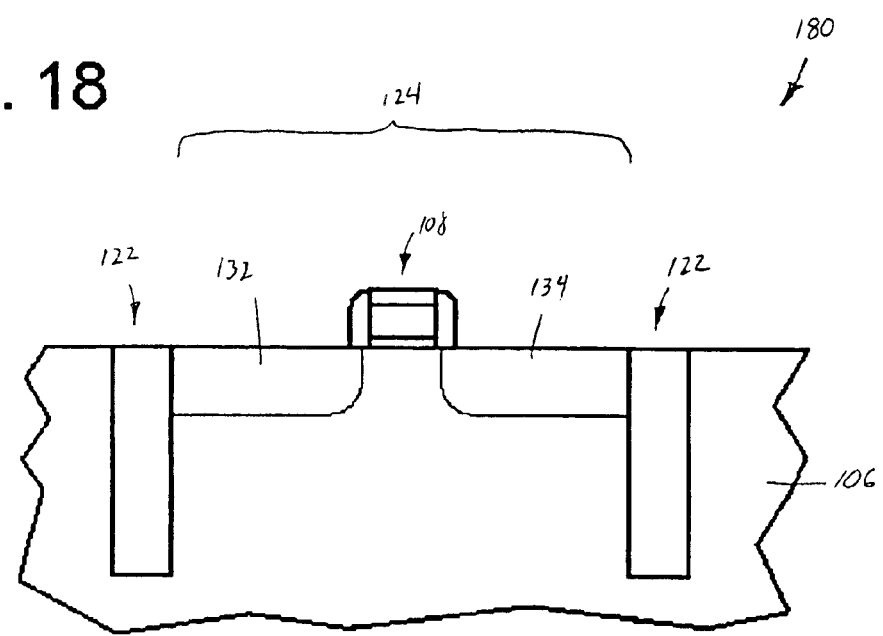
FIG. 18 is a side cross-sectional view of a pMOS device having deep isolation structures, according to the present invention.

FIG. 18 illustrates the deep trench embodiment of the present invention for a pMOS device 180 with the deep trenches formed perpendicular to the channel current direction. The pMOS device 180 illustrated in FIG. 18 is similar in structure to the nMOS device 130 illustrated in FIG. 5.

Figure 19:
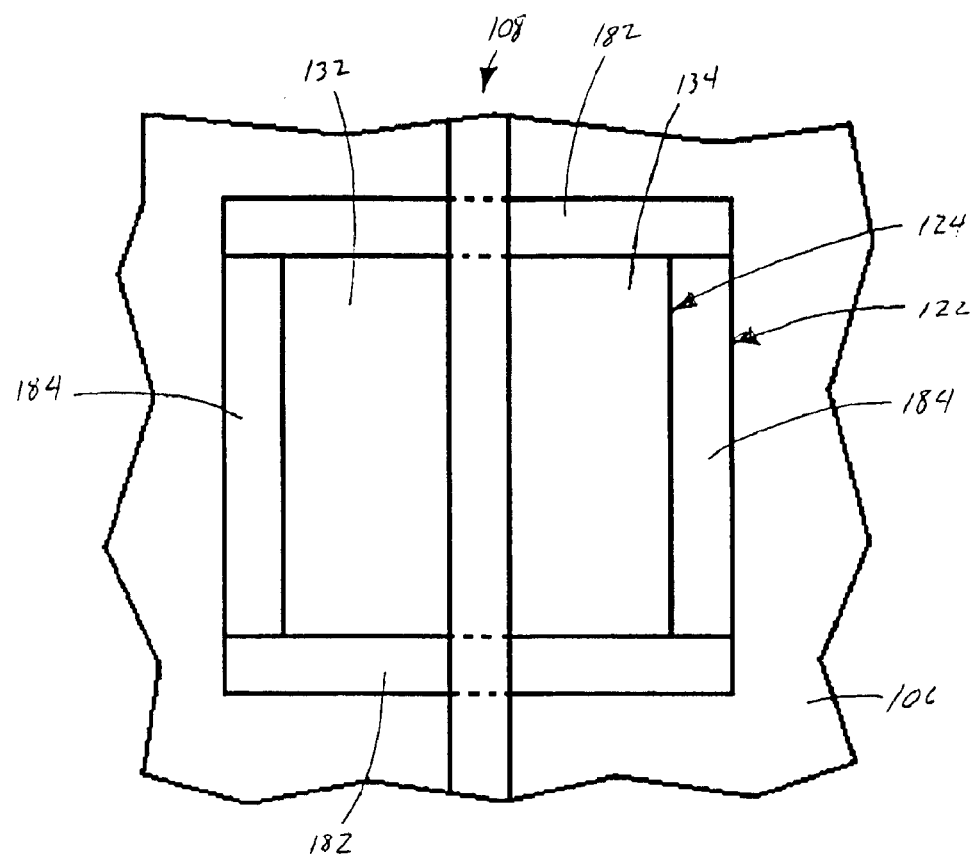
FIG. 19 is a top plan view of a pMOS device having stress modifying isolation structures for optimizing pMOS performance when under compressive stress, according to the present invention.

As illustrated in FIG. 19, when the pMOS device 180 is subjected to biaxial compressive stresses (e.g., flip-chip packaging configurations), the isolation structure depth is increased only in portions 182 of the isolation structure 122 which are parallel to the channel current direction in order to eliminate or lessen the detrimental compressive stresses perpendicular to the channel current direction. In order to further reduce detrimental compressive stresses on the active area 124 perpendicular to the channel current direction, a low-modulus dielectric material (such as described in regard to FIG. 6) or a tensile stress-inducing, dielectric material (such as described in regard to FIG. 13) may be disposed in isolation structure portions 182. Portions 184 of the isolation structure 122 which are perpendicular to the channel current direction are of a depth sufficient to isolate the active area 124, but may translate beneficial compressive stress to the active area 124 parallel to the channel current direction. In order to further translate or induce beneficial compressive stress to the active area 124 parallel to the channel current direction, the isolation structure portions 184, a high-modulus dielectric material (such as described in regard to FIG. 6) or a compressive stress-inducing, dielectric material (such as described in regard to FIG. 13) may be disposed in isolation structure portions 184.

Figure 20:
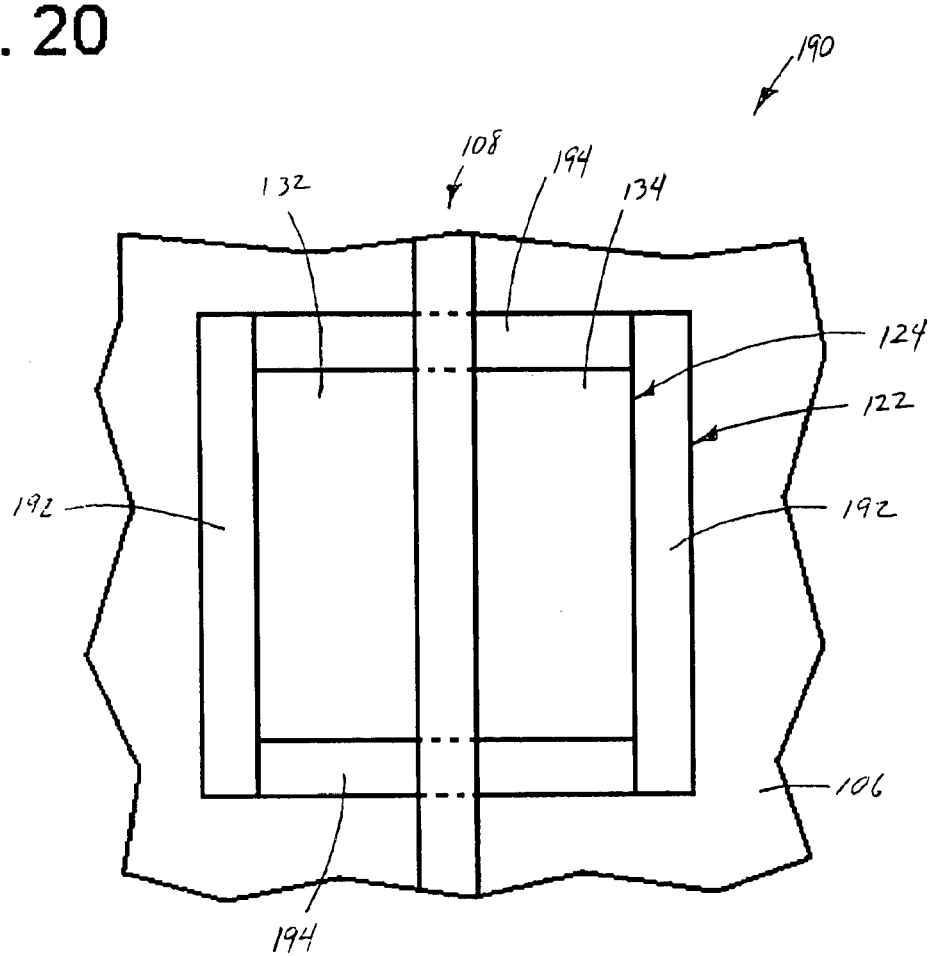
FIG. 20 is a top plan view of a pMOS device having stress modifying isolation structures for optimizing pMOS performance when under tensile stress, according to the present invention.
Figure 21:
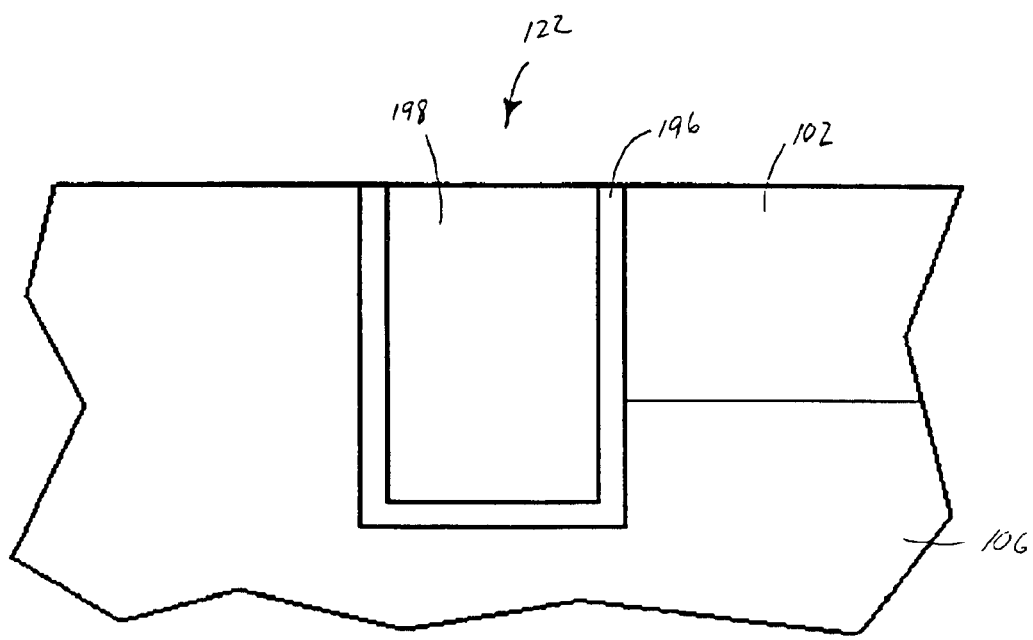
FIG. 21 is a side cross-sectional view of an isolation structure having a conformal barrier layer, according to the present invention.
Figure 22:
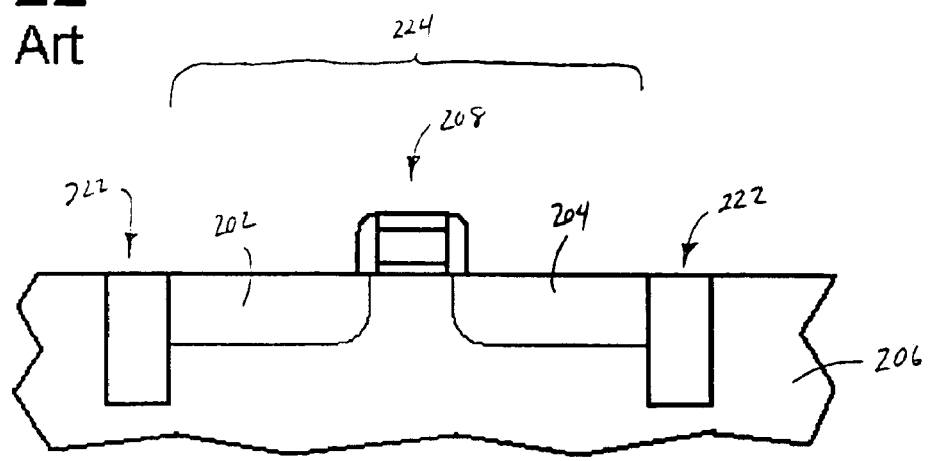
FIGS. 22 and 23 are side cross-sectional and top plan views, respectively, of components of a MOSFET, as known in the art.
Figure 23:
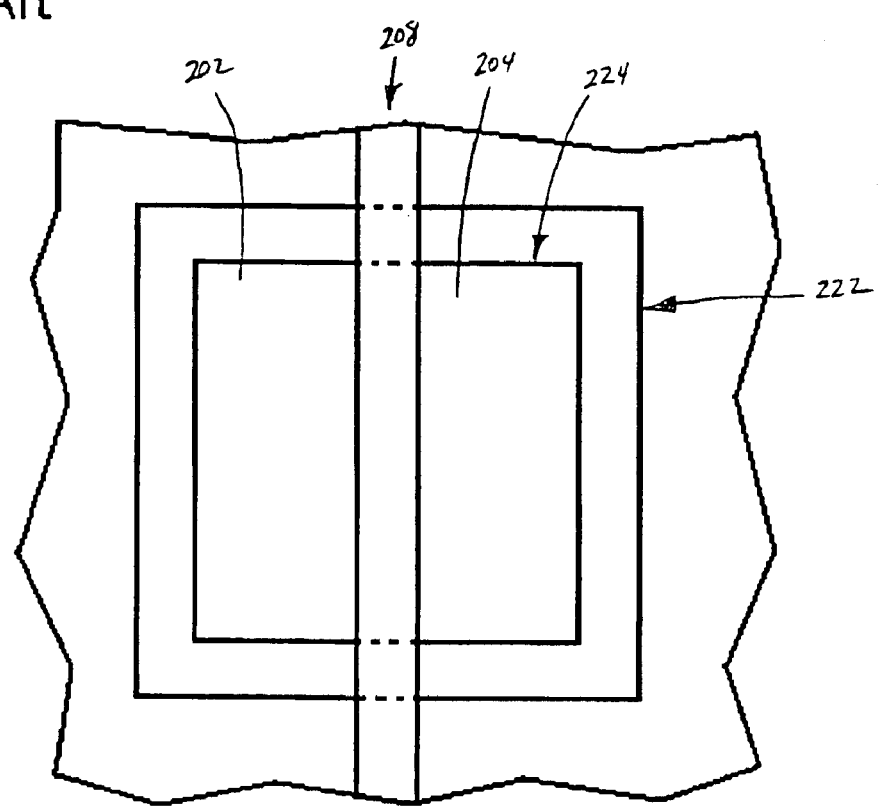
Figure 24:
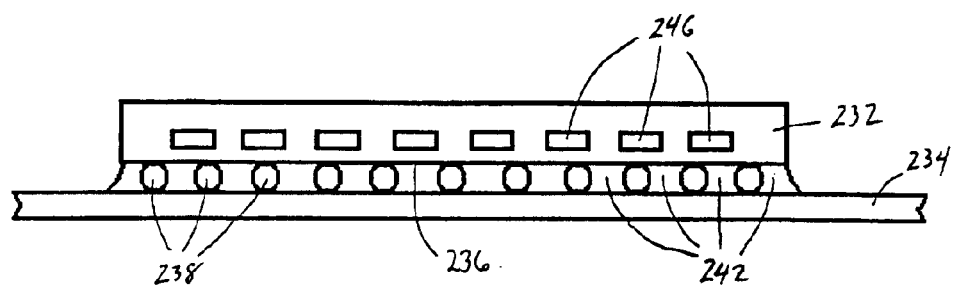
FIG. 24 is a side cross-sectional view of a flip-chip packaging configuration, as known in the art.
Figure 25:
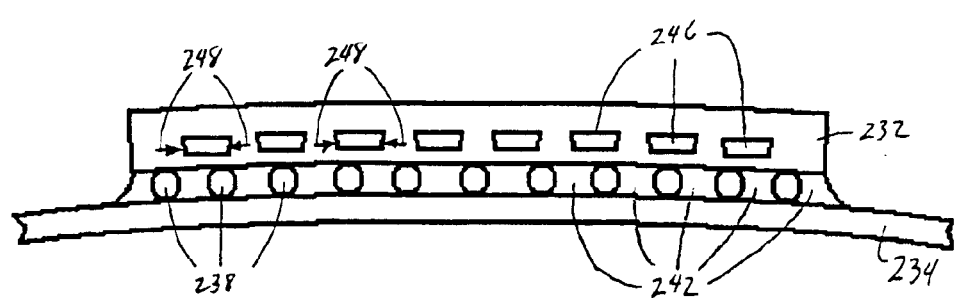
FIG. 25 is a side cross-sectional view of the flip-chip package configuration of FIG. 24 bending under thermal expansion mismatch stresses, as known in the art.

When the pMOS device 190 is subjected to biaxial tensile stresses (e.g., back-bonded packaging configurations), the isolation structure depth is increased for the isolation structure depth is increased only in portions 192 of the isolation structure 122 which are perpendicular to the channel current direction in order to eliminate or lessen the detrimental tensile stresses parallel to the channel current direction, as shown in FIG. 20. In order to further reduce detrimental tensile stresses on the active area 124 perpendicular to the channel current direction, a low-modulus dielectric material (such as described in regard to FIG. 6) or a compressive stress-inducing, dielectric material (such as described in regard to FIG. 13) may be disposed in isolation structure portions 192. Portions 194 of the isolation structure 122 which are parallel to the channel current direction are of a depth sufficient to isolate the active area 124, but may translate beneficial tensile stress to the active area 124 perpendicular to the channel current direction. In order to further translate or induce beneficial tensile stress to the active area 124 perpendicular to the channel current direction, the isolation structure portions 194, a high-modulus dielectric material (such as described in regard to FIG. 9) or a tensile stress-inducing, dielectric material (such as described in regard to FIG. 13) may be disposed in isolation structure portions 194.

It is also understood, that the introduction of various low-modulus and high-modulus dielectric material, and compressive stress-inducing and tensile stress-inducing, dielectric materials may degrade the interface between the active area and the dielectric material and cause leakage problems. Thus, a thin conformal barrier layer 196, such as a conformal layer of silicon dioxide 196 may be deposited in the isolation structure 122 prior to depositing any of the various dielectric materials 198, as shown FIG. 21.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region; and
an isolation structure comprising at least one dielectric material disposed within a trench which extends into said semiconductor substrate, wherein said isolation structure substantially surrounds said active area, wherein said isolation structure comprises a low-modulus, dielectric material disposed within at least a portion of said trench parallel to a channel current direction of the pMOS device components, and wherein said isolation structure comprises a high-modulus, dielectric material disposed within at least a portion of said trench perpendicular to the channel current direction of the pMOS device components.

2. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region; and
an isolation structure comprising at least one dielectric material disposed within a trench which extends into said semiconductor substrate, wherein said isolation structure substantially surrounds said active area, wherein said isolation structure comprises a low-modulus, dielectric material disposed within at least a portion of said trench perpendicular to a channel current direction of the pMOS device components, and wherein said isolation structure comprises a high-modulus, dielectric material disposed within at least a portion of said trench parallel to the channel current direction of the pMOS device components.

3. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region; and
an isolation structure comprising at least one dielectric material disposed within a trench which extends into said semiconductor substrate, wherein said isolation structure substantially surrounds said active area, wherein at least a portion of said isolation structure is adapted to modify stresses incurred on said active area, and wherein said isolation structure comprises a tensile stress-inducing, dielectric material disposed within said at least a portion of said trench parallel to the channel current direction of the pMOS device components.

4. The semiconductor device of claim 3, wherein said isolation structure comprises at least a portion of said trench parallel to a channel current direction of the pMOS device components having a depth wherein said active area includes a width and wherein said isolation structure comprises at least a portion of said trench parallel to a channel current direction of the pMOS device components having a depth such that an aspect ratio of said trench portion depth to said active area width is greater than about 0.5.

5. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region;
an isolation structure comprising at least one dielectric material disposed within a trench which extends into said semiconductor substrate, wherein said isolation structure substantially surrounds said active area, wherein at least a portion of said isolation structure is adapted to modify stresses incurred on said active area;
wherein said isolation structure comprises at least a portion of said trench parallel to a channel current direction of the pMOS device components having a depth wherein said active area includes a width and wherein said isolation structure comprises at least a portion of said trench parallel to a channel current direction of the pMOS device components having a depth such that an aspect ratio of said trench portion depth to said active area width is greater than about 0.5;
and wherein said isolation structure comprises a high-modulus, dielectric material disposed within said at least a portion of said trench perpendicular to the channel current direction of the pMOS device components.

6. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region;
an isolation structure comprising at least one dielectric material disposed within a trench which extends into said semiconductor substrate, wherein said isolation structure substantially surrounds said active area, and wherein at least a portion of said isolation structure is adapted to modify stresses incurred on said active area;
wherein said active area includes a width and wherein said isolation structure comprises at least a portion of said trench perpendicular to a channel current direction of the pMOS device components having a depth such that an aspect ratio of said trench portion depth to said active area width is greater than about 0.5; and
wherein said isolation structure comprises a high-modulus, dielectric material disposed within said at least a portion of said trench parallel to the channel current direction of the pMOS device components.

7. A semiconductor device, comprising:
an active area formed in a semiconductor substrate, wherein said active area comprises pMOS device components including a p-type source region, a p-type drain region, and a gate structure disposed adjacent said active area between said p-type source region and said p-type drain region;
an isolation structure comprising at least one dielectric material disposed within a trench which extends into said semiconductor substrate, wherein said isolation structure substantially surrounds said active area, and wherein at least a portion of said isolation structure is adapted to modify stresses incurred on said active area;

wherein said active area includes a width and wherein said isolation structure comprises at least a portion of said trench perpendicular to a channel current direction of the pMOS device components having a depth such that an aspect ratio of said trench portion depth to said active area width is greater than about 0.5; and wherein said isolation structure comprises a tensile stress-inducing, dielectric material disposed within said at least a portion of said trench parallel to the channel current direction of the pMOS device components.

* * * * *

UNITED STATES PATENT AND TRADEMARK OFFICE
CERTIFICATE OF CORRECTION

PATENT NO. : 6,876,053 B1
DATED : April 5, 2005
INVENTOR(S) : Ma et al.

It is certified that error appears in the above-identified patent and that said Letters Patent is hereby corrected as shown below:

Column 7,
Line 36, delete "11.0" and insert -- 1.0 --.
Line 47, delete "HWA" and insert -- H/A --.

Signed and Sealed this

Twenty-eighth Day of June, 2005

JON W. DUDAS
*Director of the United States Patent and Trademark Office*